US008421030B2

(12) United States Patent
Shadman et al.

(10) Patent No.: US 8,421,030 B2
(45) Date of Patent: Apr. 16, 2013

(54) CHARGED-PARTICLE ENERGY ANALYZER

(75) Inventors: Khashayar Shadman, Mountain View, CA (US); Robert Haynes, Pleasanton, CA (US); Gabor D. Toth, San Jose, CA (US); Christopher Sears, San Jose, CA (US); Mehran Nasser Ghodsi, Hamilton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 106 days.

(21) Appl. No.: 13/119,689

(22) PCT Filed: Jul. 16, 2010

(86) PCT No.: PCT/US2010/042313
§ 371 (c)(1),
(2), (4) Date: Mar. 17, 2011

(87) PCT Pub. No.: WO2011/009065
PCT Pub. Date: Jan. 20, 2011

(65) Prior Publication Data
US 2011/0168886 A1 Jul. 14, 2011

Related U.S. Application Data
(60) Provisional application No. 61/226,682, filed on Jul. 17, 2009.

(51) Int. Cl.
*G01K 1/08* (2006.01)
(52) U.S. Cl.
USPC .................. 250/397; 250/396 R; 250/305
(58) Field of Classification Search .................. 250/397, 250/396 R, 398, 400, 305, 306, 307
See application file for complete search history.

(56) References Cited

U.S. PATENT DOCUMENTS 3,699,331 A * 10/1972 Palmberg ............... 250/305
4,107,526 A * 8/1978 McKinney et al. ......... 250/305
(Continued)

FOREIGN PATENT DOCUMENTS
JP 06-162991 6/1994
JP 08-007831 1/1996
WO WO 2005122208 A2 * 12/2005

OTHER PUBLICATIONS

Joseph Ladislas Wisa "Microchannel Plate Detectors", 1979, pp. 587-601, Nuclear Instruments and Methods, vol. 162, ISO 9001 BURLE.

(Continued)

*Primary Examiner* — Robert Kim
*Assistant Examiner* — Jason McCormack
(74) *Attorney, Agent, or Firm* — Okamoto & Benedicto LLP

(57) ABSTRACT

One embodiment relates to a charged-particle energy analyzer apparatus. A first mesh is arranged to receive the charged particles on a first side and pass the charged particles to a second side, and a first electrode is arranged such that a first cavity is formed between the second side of the first mesh and the first electrode. A second mesh is arranged to receive the charged particles on a second side and pass the charged particles to a first side, and a second electrode is arranged such that a second cavity is formed between the first side of the second mesh and the second electrode. Finally, a third mesh is arranged to receive the charged particles on a first side and pass the charged particles to a second side, and a position-sensitive charged-particle detector is arranged to receive the charged particles after the charged particles pass through the third mesh.

21 Claims, 7 Drawing Sheets

U.S. PATENT DOCUMENTS

| | | | |
|---|---|---|---|
| 4,224,518 A * | 9/1980 | Taylor | 250/305 |
| 4,367,406 A * | 1/1983 | Franzen et al. | 250/305 |
| 5,032,723 A | 7/1991 | Kono | |
| 5,365,064 A | 11/1994 | Rettinghaus | |
| 5,381,003 A | 1/1995 | Suzuki | |
| 6,762,408 B1 | 7/2004 | Read | |
| 7,560,691 B1 | 7/2009 | Gubbens | |
| 2002/0161534 A1 * | 10/2002 | Adler et al. | 702/35 |
| 2006/0226361 A1 * | 10/2006 | Frosien et al. | 250/310 |
| 2008/0197277 A1 | 8/2008 | Nasser-Ghodsi et al. | |
| 2009/0200463 A1 * | 8/2009 | Degenhardt et al. | 250/307 |
| 2010/0127168 A1 | 5/2010 | Khursheed | |

OTHER PUBLICATIONS

A.R. Chourasia and D.R. Chopra "Auger Electron Spectroscopy", pp. 791-808, Chapter 42 Handbook of Instrumental Techniques for Analytical Chemistry, Texas A&M University—Commerce Department of Physics, [retrieved on Mar. 17, 2011], Retrieved from the Internet: http://www.prenhall.com/settle/chapters/ch42.pdf.

PCT International Search Report for PCT/US2010/042313, 3 sheets, Feb. 21, 2011.

* cited by examiner

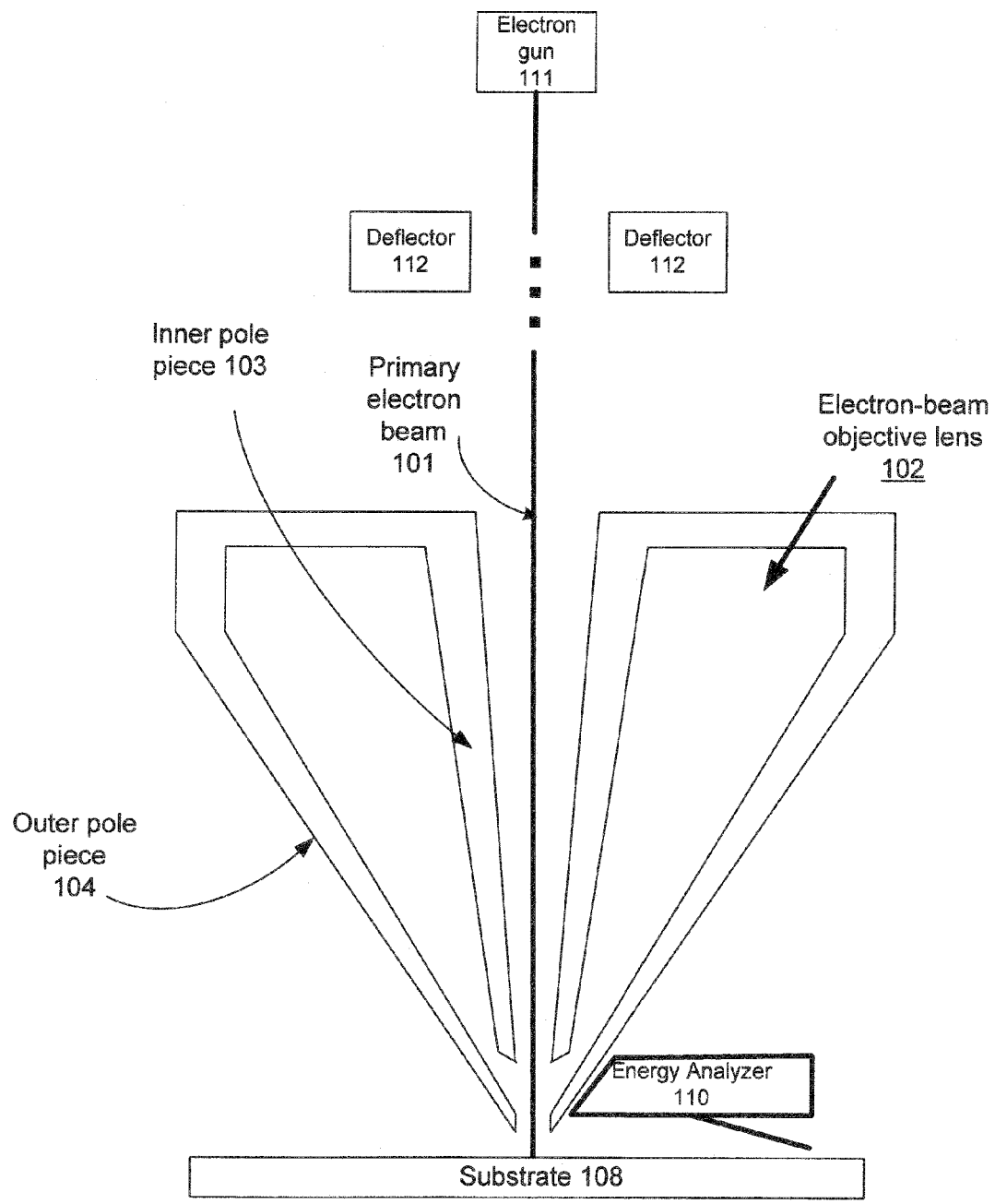
FIG. 1
(Conventional)
100

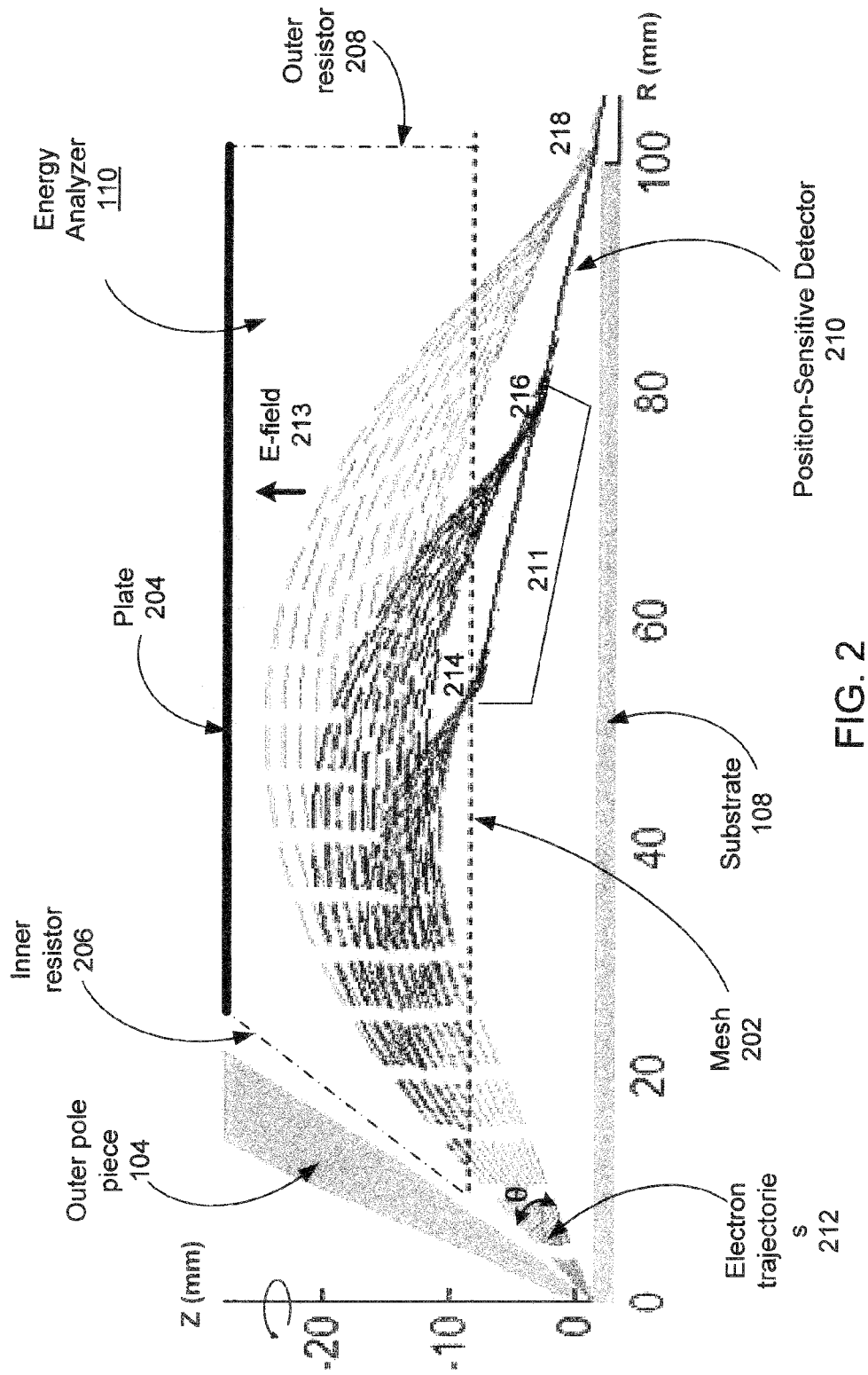
FIG. 2
(Conventional)

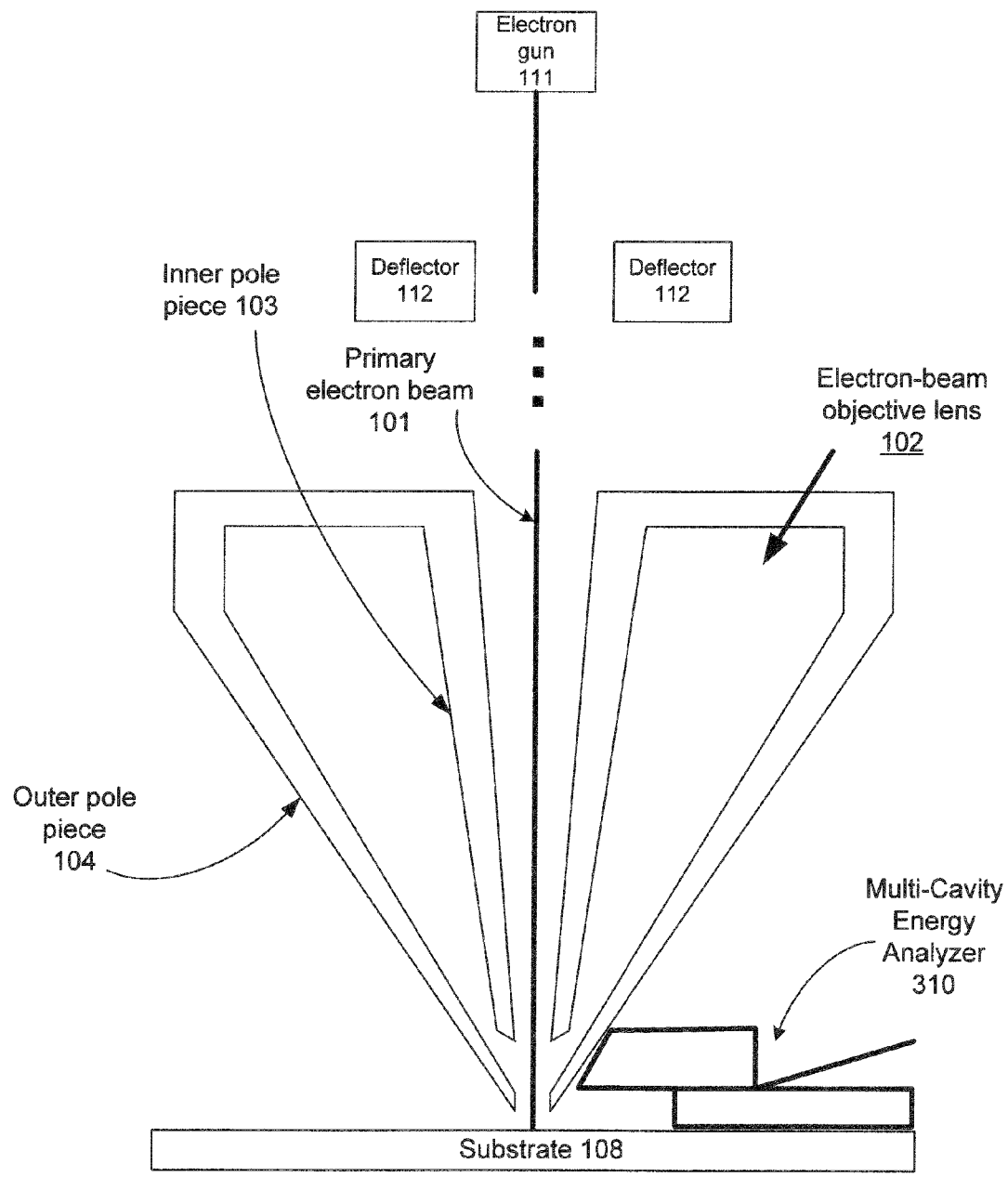
FIG. 3    300

CHARGED-PARTICLE ENERGY ANALYZER

CROSS-REFERENCE TO RELATED APPLICATION

The present application claims priority to U.S. Provisional Patent Application No. 61/226,682, entitled "Energy Analyzer," filed Jul. 17, 2009 by inventor Khashayar Shadman, the disclosure of which is hereby incorporated by reference in its entirety.

BACKGROUND OF THE INVENTION

1. Field of the Invention

The present disclosure relates to energy analyzers for charged-particles.

2. Description of the Background Art

When an electron is emitted from a core level of an atom, leaving a vacancy, an electron from a higher energy level may fall into the lower-energy-level vacancy. This results in a release of energy either in the form of an emitted photon or by ejecting another electron. Electrons ejected in this manner are called Auger electrons.

Conventional Auger electron spectrometers include the hemispherical analyzer, the cylindrical mirror analyzer, and the hyperbolic field analyzer. The hemispherical analyzer and the cylindrical mirror analyzer are serial spectrometers where the spectrometer is scanned in order to collect a complete spectrum in a serial fashion. The hyperbolic field analyzer is an example of a parallel spectrometer where a complete spectrum is acquired in parallel fashion.

BRIEF DESCRIPTION OF THE DRAWINGS

FIG. 1 is a cross-sectional diagram depicting select components of a scanning electron microscope which includes a conventional energy analyzer.

FIG. 2 is a cross-sectional diagram showing the conventional energy analyzer in further detail and electron trajectories therein.

FIG. 3 is a cross-sectional diagram depicting select components of a scanning electron microscope which includes a multi-cavity energy analyzer in accordance with an embodiment of the invention.

SUMMARY

Figure 4A:
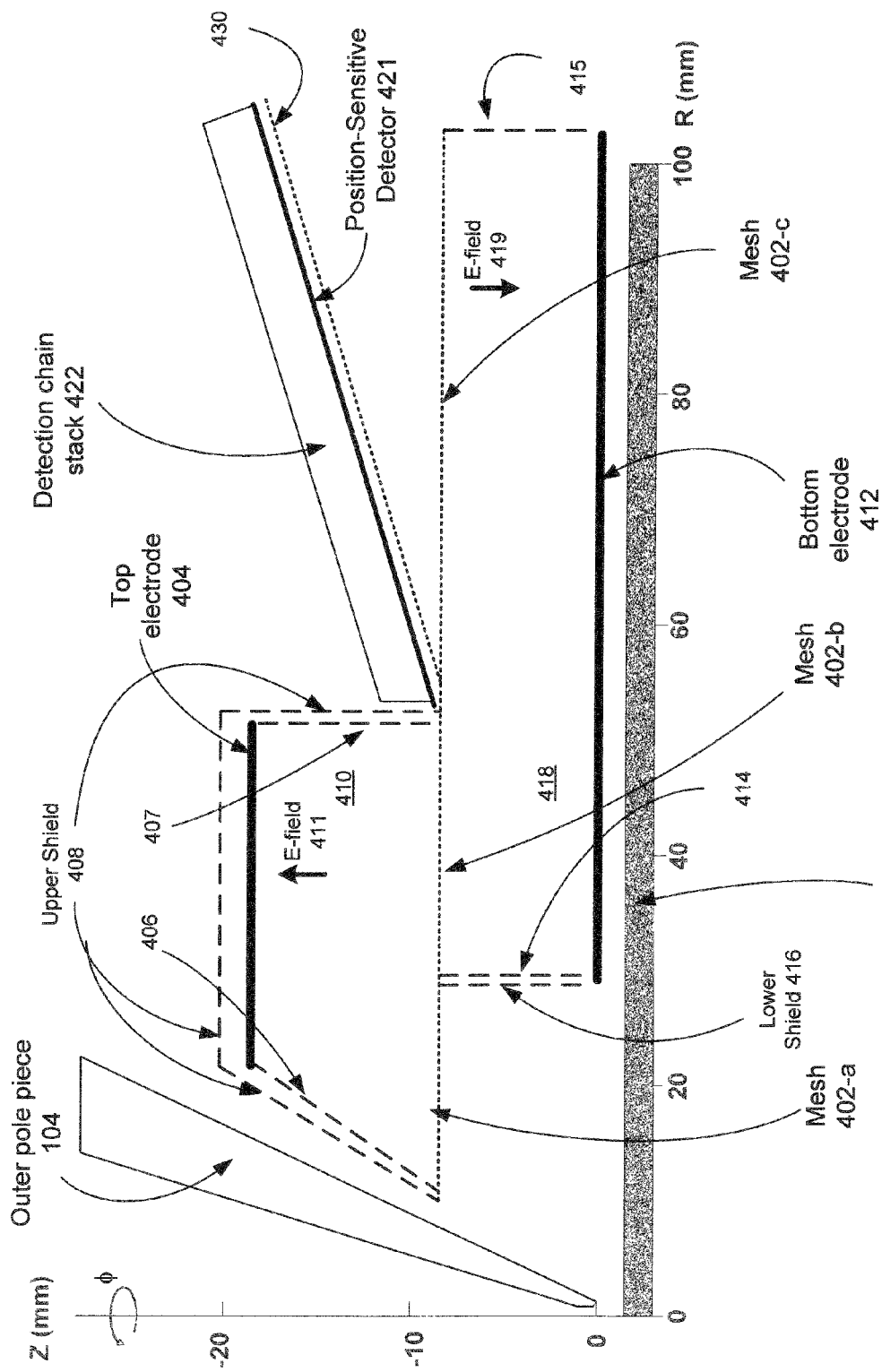
FIG. 4A is a cross-sectional diagram showing the multi-cavity energy analyzer in further detail in accordance with an embodiment of the invention.

One embodiment relates to a charged-particle energy analyzer apparatus. A first mesh is arranged to receive the charged particles on a first side and pass the charged particles to a second side, and a first electrode is arranged such that a first cavity is formed between the second side of the first mesh and the first electrode. A second mesh is arranged to receive the charged particles on a second side and pass the charged particles to a first side, and a second electrode is arranged such that a second cavity is formed between the first side of the second mesh and the second electrode. Finally, a third mesh is arranged to receive the charged particles on a first side and pass the charged particles to a second side, and a position-sensitive charged-particle detector is arranged to receive the charged particles after the charged particles pass through the third mesh. The first, second and third meshes may be separate or part of a single mesh structure.

Another embodiment relates to a method of analyzing energies of charged particles. The charged particles are passed through a first electrically-conductive mesh to enter a first cavity. In the first cavity, the charged particles are deflected away from a first electrically-conductive plate. The charged particles then pass through a second electrically-conductive mesh to exit the first cavity and enter a second cavity. In the second cavity, the charged particles are deflected away from a second electrically-conductive plate. The charged particles then pass through a third electrically-conductive mesh to exit the second cavity. After exiting the second cavity, the charged particles are detected with a position-sensitive detector. The first, second and third meshes may be separate or part of a single mesh structure.

Other embodiments, aspects and features are also disclosed.

DETAILED DESCRIPTION

FIG. 1 is a cross-sectional diagram depicting select components of a scanning electron microscope which includes a conventional energy analyzer 110. As shown, a primary electron beam 101 originates from an electron gun 111 and travels down an optical axis and through an electron-beam objective lens 102 to become focused upon the surface of a target substrate 108.

The objective lens 102 is configured around the optical axis. The objective lens 102 may comprise an inner pole piece 103 and an outer pole piece 104. The objective lens 102 may be configured with an electromagnetic device (such as a magnetic coil) so as to generate a magnetic field which may be used to focus the primary electron beam 101 onto a spot on a surface of the substrate 108. Deflectors 112 may be used to deflect the primary electron beam 101 in a controllable manner so as to scan the beam spot over the surface, for example, in a raster pattern.

The energy analyzer 110 is positioned to detect secondary electrons emitted from the substrate 108 due to the impingement of the primary electron beam. The operation of the energy analyzer 110 is described further below in relation to FIG. 2.

FIG. 2 is a cross-sectional diagram showing the conventional energy analyzer 110 in further detail and electron trajectories 212 therein. In FIG. 2, the optical axis of the apparatus is defined to be the z-axis. Hence, the primary electron beam 101 travels on the z-axis and then impinges upon the target substrate 108. The R-axis in FIG. 2 indicates the radial distance away from the z-axis.

As shown, the energy analyzer 110 may be arranged radially around the z-axis. The energy analyzer 110 includes an annular electrically-conductive mesh 202 which is electrically grounded and an annular electrically-conductive plate 204 which is biased at a negative voltage of −V.

The mesh 202 and plate 204 may be electrically-coupled by an inner sidewall 206 and an outer sidewall 208. Together, the mesh 202, plate 204, and sidewalls (206 and 208) form a chamber or cavity in which there is a relatively uniform electrostatic field (E-field) 213 going away from the mesh 202 and towards the plate 204.

Electron trajectories 212 are depicted for secondary electrons emitted from the target substrate 108. As indicated, the secondary electrons whose trajectories 212 are within a certain range of polar angles θ may pass through the mesh 202 and enter the chamber of the energy analyzer 110.

Since the electrons are negatively-charged, the E-field 213 provides a downward force so that the electron trajectories 212 are deflected away from the plate 204. The deflected electrons pass through the mesh 202 and impinge upon a position-sensitive detector 210.

Higher-energy electrons travel farther and impinge upon the position-sensitive detector 210 at positions farther away from the z-axis. For purposes of illustration, FIG. 2 depicts the trajectories of electrons with various initial polar angles θ but with one of three example energy levels. The electrons at the lower energy level land at a closer radial position 214 along the position-sensitive detector 210. The electrons at the middle energy level land at a middle radial position 216 along the position-sensitive detector 210. Finally, the electrons at the higher energy level land at a farther radial position 218 along the position-sensitive detector 210.

One problem with the design of the energy analyzer 110 in FIG. 2 is that there is very little space for the detection chain stack 211 between the position-sensitive detector 210 and the target substrate 108. In the context of a microchannel plate detector, the detection chain stack 211 refers to a plurality of microchannel plates used to increase the gain of the detector. In cases where such a detection chain stack 211 is necessary, then the radial extent of the detector 210 would be limited, which would reduce the range of energies that may be detected in parallel.

FIG. 3 is a cross-sectional diagram depicting select components of a scanning electron microscope which includes a multi-cavity energy analyzer 310 in accordance with an embodiment of the invention. As shown, a primary electron beam 101 originates from an electron gun 111 and travels down an optical axis and through an electron-beam objective lens 102 to become focused upon the surface of a target substrate 108.

The objective lens 102 is configured around the optical axis. The objective lens 102 may comprise an inner pole piece 103 and an outer pole piece 104. The objective lens 102 may be configured with an electromagnetic device (such as a magnetic coil) so as to generate a magnetic field which may be used to focus the primary electron beam 101 onto a spot on a surface of the substrate 108. Deflectors 112 may be used to deflect the primary electron beam 101 in a controllable manner so as to scan the beam spot over the surface, for example, in a raster pattern.

In accordance with an embodiment of the invention, the multi-cavity energy analyzer 310 is positioned to detect and analyze the secondary (or scattered) electrons emitted from the substrate 108 due to the impingement of the primary electron beam 101. The operation of the multi-cavity energy analyzer 310 is described further below in relation to FIGS. 4A and 4B.

Figure 4B:
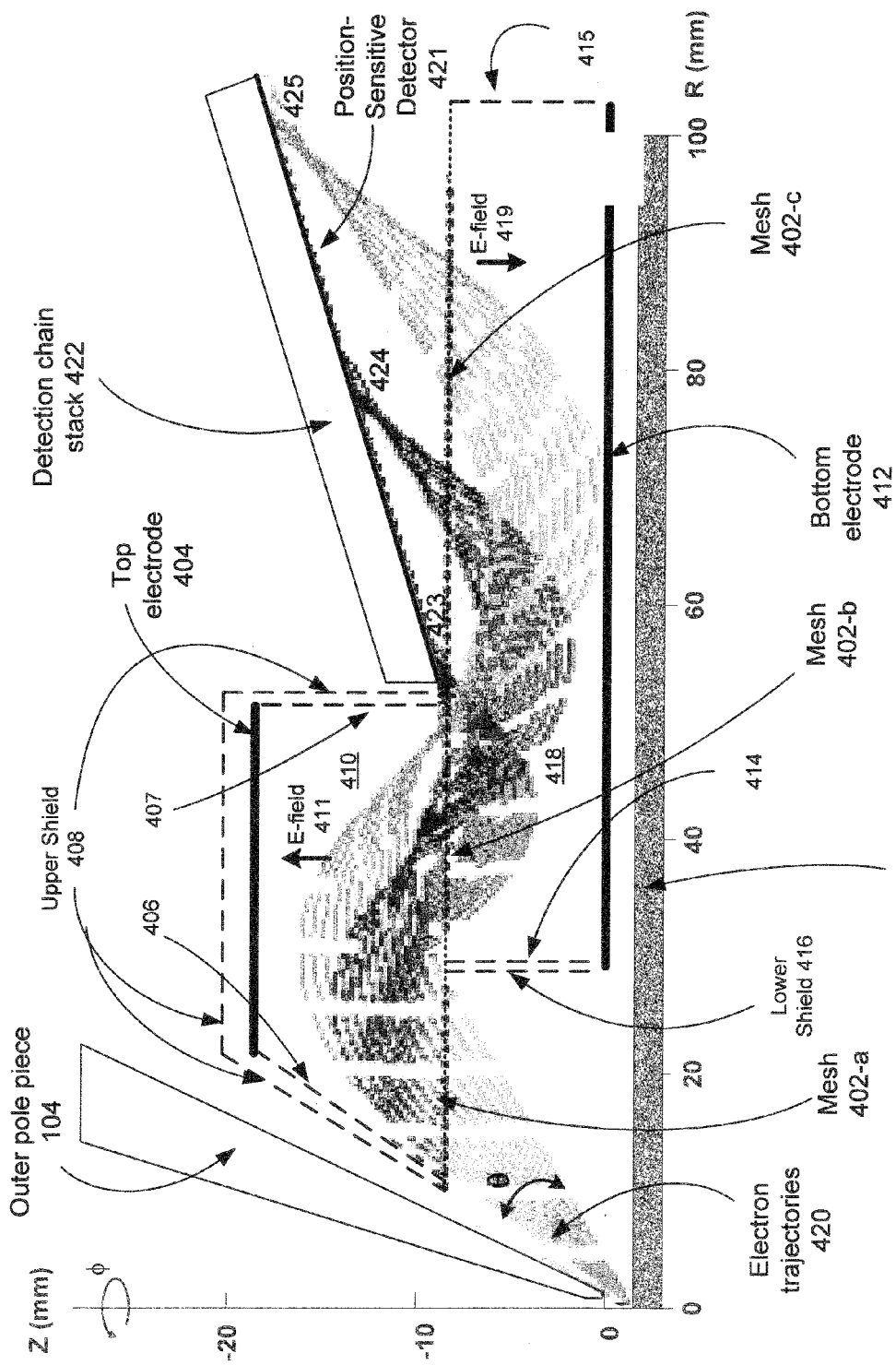
FIG. 4B showing electron trajectories superimposed on the multi-cavity energy analyzer of FIG. 4A.

FIG. 4A is a cross-sectional diagram showing the multi-cavity energy analyzer 310 in further detail in accordance with an embodiment of the invention. FIG. 4B shows electron trajectories 420 superimposed on the multi-cavity energy analyzer 310 of FIG. 4A. In FIGS. 4A and 4B, the optical axis of the apparatus is defined to be the z-axis. Hence, the primary electron beam 101 travels on the z-axis and then impinges upon the target substrate 108. The R-axis indicates the radial distance away from the z-axis.

The multi-cavity energy analyzer 310 may be arranged in a radially-symmetric around the z-axis. In that case, the multi-cavity energy analyzer 310 includes an annular electrically-conductive central mesh 402 (comprising an inner portion 402-a, a middle portion 402-b, and an outer portion 402-c) which is electrically grounded, a first annular electrically-conductive electrode ("top electrode") 404 which is biased at a negative voltage of −V, and a second top annular electrically-conductive electrode ("bottom electrode") 412 which is biased at a negative voltage of −V. In one embodiment, the top and bottom electrodes (404 and 412) may comprise annular metal plates. In other embodiments, one or both of these electrodes may comprise wire meshes. Implementing the top and bottom electrodes (404 and 412) as wire meshes is advantageous in that the surface area which produces tertiary electrons is reduced.

A top inner resistor-like sidewall 406 may be configured to electrically-couple an inner end of the inner portion of the central mesh 402-a and an inner end of the top electrode 404. A top outer resistor-like sidewall 407 may be configured to electrically-couple an outer end of the middle portion of the central mesh 402-b and an outer end of the top electrode 404. Together, the inner and middle portions of the central mesh (402-a and 402-b), the top electrode 404, and the top inner and outer resistor-like sidewalls (406 and 407) form a first (top) cavity (or chamber) 410 in which there is a relatively uniform electrostatic field (E-field) 411 going away from the inner and middle portions of the central mesh (402-a and 402-b) and towards the top electrode 404. An electrically-grounded upper shield 408 may be arranged to house the upper chamber 410 and shield the E-field 411 from stray fields from the detector chain stack 421 or other components.

A bottom inner resistor-like sidewall 414 may be configured to electrically-couple an inner end of the middle portion of the central mesh 402-b and an inner end of the bottom electrode 412. A bottom outer resistor-like sidewall 415 may be configured to electrically-couple an outer end of the outer portion of the central mesh 402-c and an outer end of the bottom electrode 412. Together, the middle and outer portions of the central mesh (402-b and 402-c), the bottom electrode 412, and the bottom inner and outer resistor-like sidewalls (414 and 415) form a second (bottom) cavity (or chamber) 418 in which there is a relatively uniform electrostatic field (E-field) 419 going away from the middle and outer portions of the central mesh (402-b and 402-c) and towards the bottom electrode 412. An electrically-grounded lower shield 416 may be on the inner side of the bottom inner resistor-like sidewall 414 so as to shield the E-field 419 from stray fields and the secondary electrons.

Electron trajectories 420 are depicted in FIG. 4B for secondary electrons (SEs) emitted from the target substrate 108 due to impingement of the primary electron beam 101. As indicated, the secondary electrons whose trajectories 420 are within an acceptable range of polar angles θ may pass through an aperture and through the inner portion of the central mesh 402-a so as to enter the upper chamber 410 of the multi-cavity energy analyzer 310. The aperture may be in the form of an annular slit which is configured to limit the acceptable range of SE polar angles. For example, the acceptable range of SE polar angles θ may be centered around 30 degrees with respect to the surface of the substrate 108.

Since the electrons are negatively-charged, the E-field 411 in the upper chamber 410 provides a downward force so that the electron trajectories 420 are deflected away (mirrored) from the top electrode 404. After this first deflection, the electrons pass through the middle portion of the central mesh 402-b and enter the lower chamber 418 of the multi-cavity energy analyzer 310.

Since the electrons are negatively-charged, the E-field 419 in the lower chamber 418 provides an upward (repulsive) force so that the electron trajectories 420 are deflected away (mirrored) from the bottom electrode 412. After this second deflection, the electrons pass through the outer portion of the central mesh 402-c and impinge upon a position-sensitive detector 421. Hence, in this embodiment, the secondary electrons pass through the central mesh 402 three times before striking the detector.

Note that, as shown in FIG. 4A, a wire mesh 430 may also be configured in front of the position-sensitive detector 421. An adjustable electrostatic field may be created between the wire mesh 430 and the position-sensitive detector 421 by creating a potential difference between the two. The electrostatic field may point either towards the mesh 430 or towards the front surface of the detector 421.

The direction and strength of the field may be configured so as to either suppress or remove tertiary electrons produced at the detector surface. To suppress tertiary electrons generated at the detector surface, the electrostatic field is configured to point away from the detector surface. To remove tertiary electrons generated at the detector surface, the electrostatic field is configured to point towards the detector surface. The electrostatic field also contributes to the analyzer focus.

Higher-energy secondary electrons travel farther and impinge upon the position-sensitive detector 421 at positions farther away from the z-axis. For purposes of illustration, FIG. 4B depicts the trajectories of the secondary electrons with various initial polar angles θ but with one of three example energy levels. The secondary electrons at the low-energy level land at a close radial position 423 along the position-sensitive detector 421. The secondary electrons at the middle energy level land at a middle radial position 424 along the position-sensitive detector 421. Finally, the secondary electrons at the high energy level land at a far radial position 425 along the position-sensitive detector 421. In accordance with an embodiment of the invention, a lowest-energy level detectable by the position-sensitive detector 421 is U=eV, and a highest-energy level detectable by the position-sensitive detector 421 is U=2 eV, where e is an electron charge and −V is the potential applied to the electrodes 404 and 412.

One advantage of the multi-cavity energy analyzer 310 in FIGS. 4A and 4B is that the space for the detection chain stack 422 (for example, a stack of microchannel plates to increase the detection gain) is not constrained by the proximity of the target substrate 108. This enables the full use of the radial extent of the position-sensitive detector 421, even if high gain is needed. Another advantage of the multi-cavity energy analyzer 310 is that it reduces the background signal from tertiary electrons produced inside the analyzer cavity. This is because the tertiary electrons are less likely to follow the double-mirror S-curved path to the detector surface (compared with a more straightforward single-mirror path).

As seen in FIG. 4B, the trajectories 420 of the electrons within the multi-cavity energy analyzer 310 follow an "S" shaped curve. As such, the multi-cavity energy analyzer 310 may be thought of as an "S-Curve" energy analyzer. Since the multi-cavity energy analyzer 310 uses at least two mirror electrodes, it may also be considered to be a "tandem mirror" energy analyzer.

In accordance with an embodiment of the invention, the surface plane of the position-sensitive detector 421 is tilted approximately +11 degrees with respect to the plane of the mesh 402. (In contrast, the position-sensitive detector 210 in FIG. 2 is tilted at an opposite angle of about −11 degrees.) Applicant has determined that, at this tilted position of +11 degrees, the first and second order focusing conditions are simultaneously satisfied, thereby providing excellent energy resolution for a substantially-large polar angle opening. For example, an energy resolution of below 1% was achieved for a polar angle opening which spanned 20 degrees.

Revolving the tilted position of the detector about the z-axis (the optical axis of the electron column) results in a conical shape. Constructing such a conical-shaped detector surface may be somewhat problematic. Hence, in accordance with an embodiment of the invention, a segmented detector surface comprising trapezoidal anodes may be used to approximate the conical shape.

Figure 5:
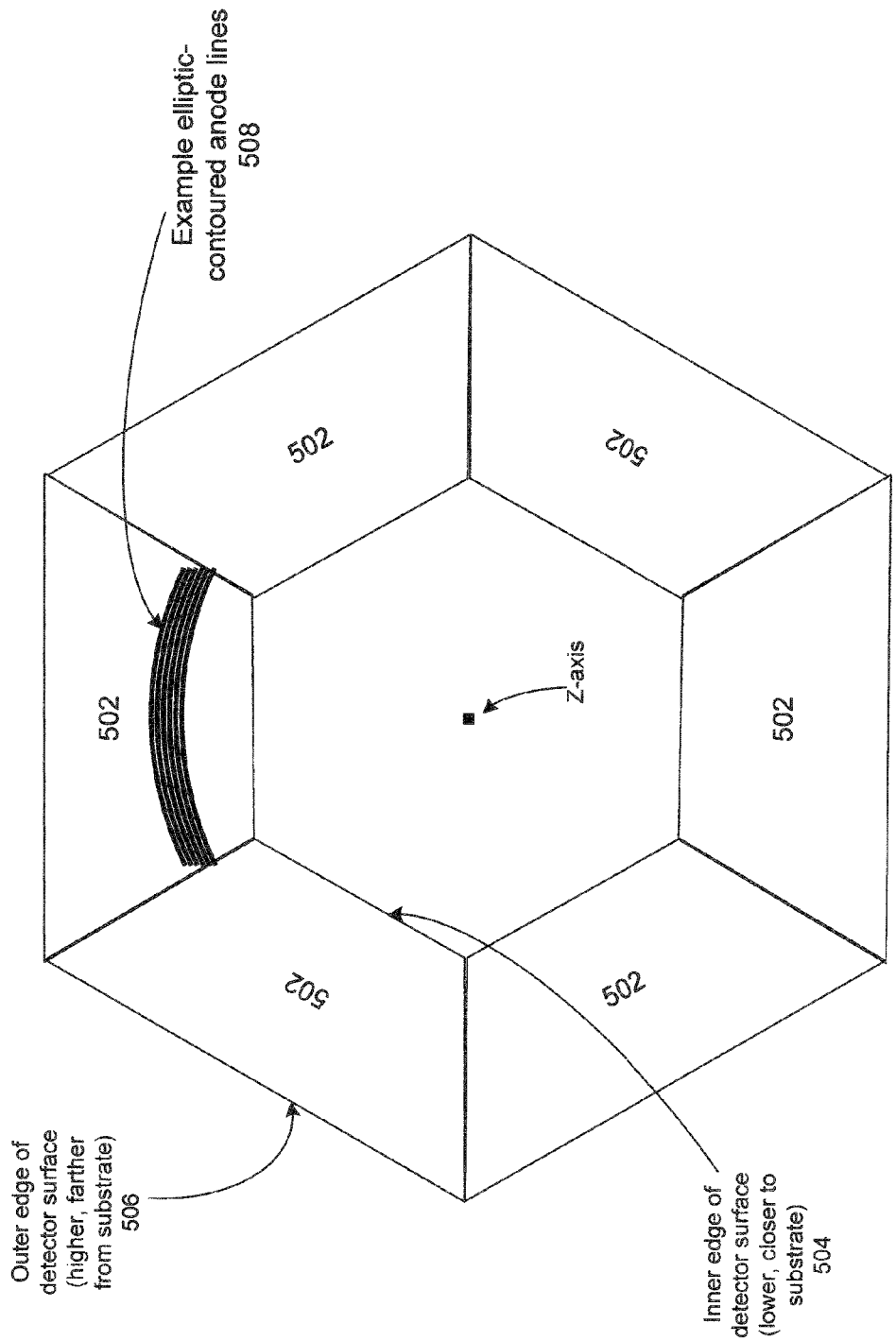
FIG. 5 is a diagram depicting an example implementation of a segmented detector surface.

FIG. 5 is a diagram depicting an example implementation of a segmented detector surface. Several trapezoidal segments 502 are shown as they are positioned around the z-axis (the optical axis of the electron column). Other implementations may have different numbers of segments 502. A greater number of segments may be used to better approximate a conical-shaped detector surface. As indicated, the inner edge 504 of the detector surface is lower, i.e. closer to the target substrate 108, while the outer edge 506 of the detector surface is higher, i.e. farther away from the target substrate 108.

To approximate an ideal landing pattern with anodes on the flat detector surfaces, the anode contours on the detector surfaces may be made to be elliptical in shape. Hence, FIG. 5 also shows several example elliptic-contoured anode lines 508 which are positioned on each detector surface. The elliptic-contour shape works well because the focal surface is actually conical in shape.

Moreover, if the detector surface is segmented (and sufficient space is between segments), then each segment may be rotatable in the polar direction about the origin (R=0, z=0). This enables the energy analyzer to sample polar ranges associated with higher or lower take-off angles.

In accordance with an embodiment of the invention, a large polar angle opening (for example, spanning about 20 degrees) may be combined with a detector surface which spans a full 360 degree range in azimuth angle Applicants have determined that, with such a configuration, the multi-cavity energy analyzer 310 is able to collect a substantial fraction of about 30% of the secondary electron current. Furthermore, because the aforementioned focusing conditions are independent of the electron energy, the parallel acquisition of a range of energies may be made simultaneously.

Note that the range of energies that may be detected in parallel may be limited by the overlapping of the high and low energy electrons at the detector plane such that there is a maximum theoretical high-to-low energy ratio of approximately 2.0. In this case, the spectrum from a desired energy range, for example, from a low energy of $U_L$ to a high energy of $U_H$, may be acquired in approximately $N=\log(U_H/U_L)/\log(2)$ steps.

Figure 6:
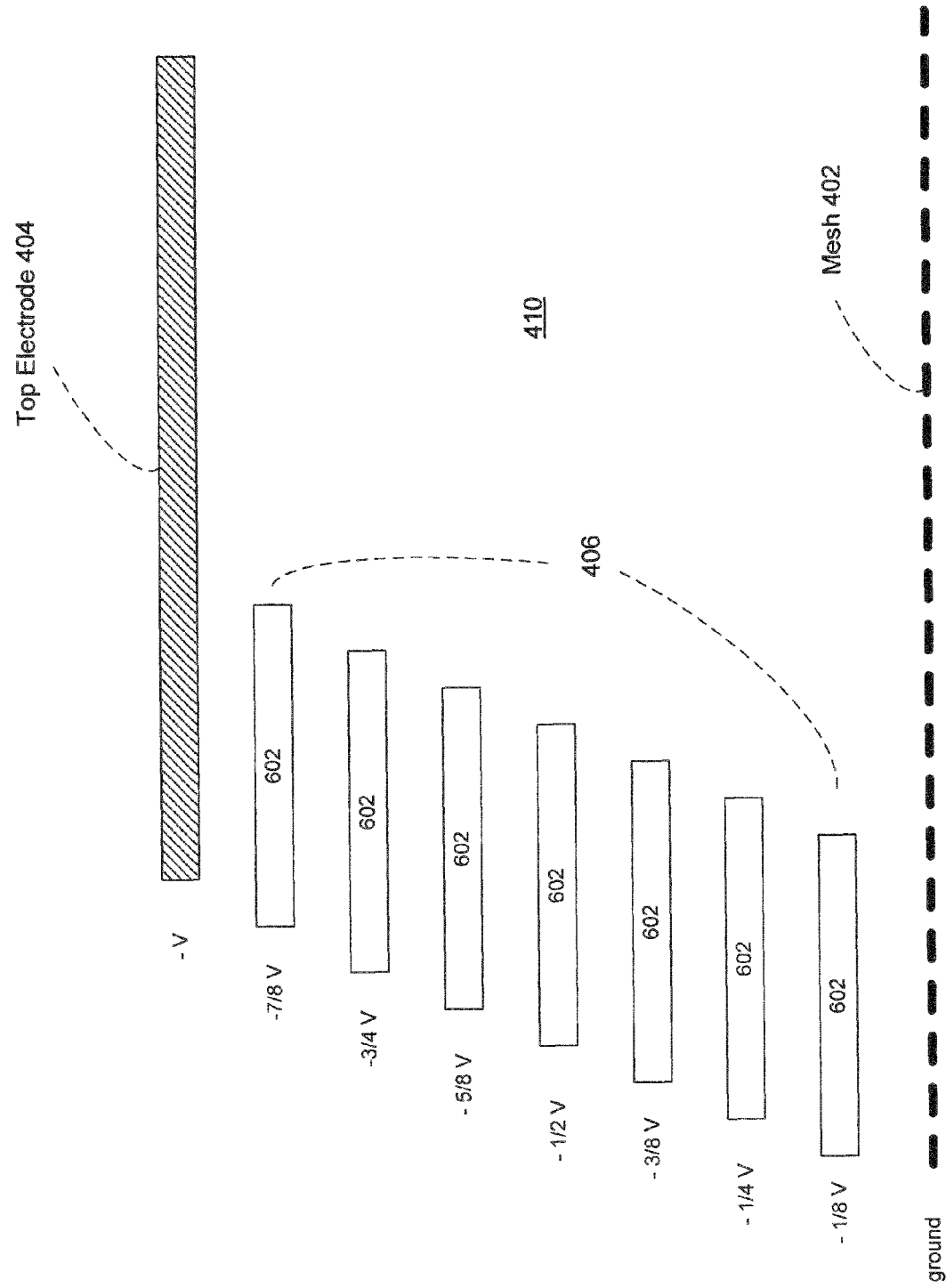
FIG. 6 is a diagram depicting an exemplary voltage step-down array in accordance with an embodiment of the invention.

FIG. 6 is a cross-sectional diagram illustrating a resistor-like sidewall implemented using a voltage step-down array in accordance with an embodiment of the invention. In this case, the voltage step-down array depicted is used for the top inner resistor-like sidewall 406 which is arranged between the top electrode 404 and the central mesh 402. The same basic structure may be used for the other resistor-like sidewalls (407, 414, and 415) of the energy analyzer.

As shown, the resistor-like sidewall 406 may be formed using a series of rails 602 to which are applied the step-down voltages. In the particular example illustrated, there are seven rails 602 for the sidewall 406, and the step-down voltages are in increments of ⅛ V, where −V is the voltage applied to the top electrode 404 and the central mesh 402 is at electrical ground. (If the cavities are segmented, then the ends of corresponding inner and outer rails may be connected by radial rail segments.)

In an alternate embodiment, the resistor-like sidewalls (406, 407, 414, and 415) may comprise sidewalls having a resistive coating. In such an embodiment, the resistive coating effectively transitions the voltage in a continuous (i.e. analog) manner from the top 404 (or bottom 412) electrode to the central mesh 402.

Although embodiments of the multi-cavity energy analyzer 310 which are radially-symmetric (or approximately radially-symmetric) around the z-axis are described above, other embodiments may be implemented which are radially-asymmetric around the z-axis. The multi-cavity energy analyzer 310 generally comprises three electrodes: two parallel plates which are biased negatively with respect to a mesh that is positioned in between. The surface of these electrodes need not have any specific shape. The shape of the electrodes may, for example, be rectangular or circular in nature. The electrodes will generally have different inner and outer radii, and they may span either a limited range in the azimuth angle to form one or more sectors or may occupy the full $2\pi$ radians (360 degrees). An opening within the inner radii provides space for the objective lens of the microscope which guides the primary electrons.

While the above description focuses on embodiments with electrons as the charged particles being detected by the energy analyzer, other embodiments may be used to detect other charged particles. For example, the charged particles being detected may be negatively or positively charged ions. If the charged particles being detected are positively-charged ions, then the voltages applied to the top and bottom electrodes (404 and 412) would be positive, and the voltage step-down arrays (406, 407, 414 and 415) would step down the positive voltage.

In addition, while the central meshes 402 is described as electrically grounded in the above-discussed embodiments, the central meshes 402 need not be grounded in accordance with other embodiments. For example, the central meshes 402 may be electrically isolated and biased with a relatively small voltage.

Furthermore, in accordance with a preferred embodiment of the invention, the central meshes 402 may be comprised of wires elongated principally in the radial direction. In this embodiment, radial perturbations of the charged-particle trajectories are advantageously reduced by minimizing the cross-wires extending in the azimuthal direction.

The above-described diagrams are not necessarily to scale and are intended be illustrative and not limiting to a particular implementation. Specific dimensions, geometries, and lens currents of the immersion objective lens will vary and depend on each implementation.

The above-described invention may be used in an automatic inspection system and applied to the inspection of wafers, X-ray masks and similar substrates in a production environment. While it is expected that the predominant use of the invention will be for the inspection of wafers, optical masks, X-ray masks, electron-beam-proximity masks and stencil masks, the techniques disclosed here may be applicable to the high speed electron beam imaging of any material (including possibly biological samples).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A charged-particle energy analyzer apparatus comprising:
    a first electically-conductive mesh with openings for passage of charged particles, the first mesh being arranged to receive the charged particles on a first side and pass the charged particles to a second side;
    a first electrode arranged such that a first cavity is formed between the second side of the first mesh and the first electrode;
    a second electrically-conductive mesh with openings for passage of the charged particles, the second mesh being arranged to receive the charged particles on a second side and pass the charged particles to a first side
    a second electrode arranged such that a second cavity is formed between the first side of the second mesh and the second electrode;
    a third electrically-conductive mesh with openings for passage of the charged particles, the third mesh being arranged to receive the charged particles on a first side and pass the charged particles to a second side; and
    a position-sensitive charged-particle detector arranged to receive the charged particles after the charged particles pass through the third mesh,
    wherein the first, second and third electrically-conductive meshes together form an annular central mesh.

2. The apparatus of claim 1, wherein the first, second and third meshes are positioned on a single plane as parts of a single mesh structure of the annular central mesh.

3. The apparatus of claim 1, wherein the first electrode comprises a first electrically-conductive plate, and the second electrode comprises a second electrically-conductive plate, further wherein the single plane lies between the first electrically-conductive plate and the second electrically-conductive plate.

4. The apparatus of claim 1, wherein the first, second and third meshes are electrically grounded, and wherein a negative voltage is applied to the first and second electrodes.

5. The apparatus of claim 1, further comprising:
    resistor-like sidewalls electrically coupling the meshes to the electrodes.

6. The apparatus of claim 5, wherein the resistor-like sidewalls comprise voltage step-down arrays.

7. The apparatus of claim 5, wherein the resistor-like sidewalls comprise sidewalls with a resistive coating.

8. The apparatus of claim 1, wherein trajectories of the charged particles enter the first cavity through the first mesh, are deflected away from the first electrode, enter the second cavity through the second mesh, are deflected away from the second electrode, and exit the second cavity through the third mesh.

9. The apparatus of claim 1, further comprising:
    a first electrically-conductive shield arranged to shield an electrostatic field in the first cavity; and a second electrically-conductive shield arranged to shield an electrostatic field in the second cavity.

10. The apparatus of claim 1, further comprising:
a metal mesh arranged in front of a surface of the position-sensitive charged-particle detector, and
an electrostatic field created by a voltage difference between the metal mesh and the surface.

11. The apparatus of claim 1, further comprising:
detector segments of the position-sensitive charged-particle detector.

12. The apparatus of claim 11, wherein the detector segments comprise trapezoidal detector surfaces.

13. The apparatus of claim 11, wherein the detector segments are rotatable in a polar direction.

14. The apparatus of claim 1, wherein the charged particles comprise electrons, the apparatus further comprising:
an electron source configured to generate a primary electron beam;
an objective lens configured to focus the primary electron beam to a spot at a surface of a target substrate; and
a deflector configured to controllably deflect the primary electron beam over the surface of the target substrate,
wherein the primary electron beam cause emission of secondary electrons from the surface of the target substrate, and
wherein trajectories of the secondary electrons go through the first and second cavities and are detected by the position-sensitive charged-particle detector,
wherein the annular central mesh is centered on an optical axis for the primary electron beam of the apparatus.

15. A method of analyzing energies of charged particles, the method comprising:
passing the charged particles through a first electrically-conductive mesh to enter a first cavity,
deflecting the charged particles away from a first electrically-conductive plate;
passing the charged particles through a second electrically-conductive mesh to exit the first cavity and enter a second cavity;
deflecting the charged particles away from a second electrically-conductive plate;
passing the charged particles through a third electrically-conductive mesh to exit the second cavity; and
detecting the charged particles with a position-sensitive detector,
wherein the first, second and third electrically-conductive meshes together form an annular central mesh.

16. The method of claim 15, wherein the first, second and third electrically-conductive meshes are positioned on a single plane as parts of a single mesh structure of the annular central mesh, further wherein the single plane lies between the first electrically-conductive plate and the second electrically-conductive plate.

17. The method of claim 15, wherein the electrically-conductive meshes are electrically grounded, and wherein a negative voltage is applied to the first and second electrically-conductive plates.

18. The method of claim 17, further comprising:
shielding the first cavity using a first electrically-conductive shield; and
shielding the second cavity with a second electrically-conductive shield.

19. The method of claim 15, wherein the charged particles comprise electrons, the method further comprising:
generating a primary electron beam using an electron gun;
focusing the primary electron beam to a spot at a surface of a target substrate;
causing emission of secondary electrons from the surface of the target substrate; and
controllably deflecting the primary electron beam over the surface of the target substrate,
wherein trajectories of the secondary electrons emitted from the surface of the target substrate travel through the first and second cavities and are detected by the position-sensitive charged-particle detector,
wherein the annular central mesh is centered on an optical axis for the primary electron beam of the apparatus.

20. The method of claim 15, further comprising:
applying an electrostatic field between a detector surface and a mesh in front of the detector surface so as to suppress or remove tertiary electrons generated at the detector surface.

21. The method of claim 15, further comprising:
polar rotation of segments of the position-sensitive charged-particle detector.

* * * * *